United States Patent
Low et al.

(10) Patent No.: US 8,525,312 B2
(45) Date of Patent: Sep. 3, 2013

(54) AREA ARRAY QUAD FLAT NO-LEAD (QFN) PACKAGE

(75) Inventors: Qwai H. Low, Cupertino, CA (US); Chok J. Chia, Cupertino, CA (US); Kishor Desai, Fremont, CA (US); Charles G. Woychik, San Jose, CA (US); Huailiang Wei, Allen, TX (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/208,822

(22) Filed: Aug. 12, 2011

(65) Prior Publication Data

US 2013/0037925 A1    Feb. 14, 2013

(51) Int. Cl.
*H01L 23/495*    (2006.01)
*H01L 21/50*    (2006.01)
*H01L 21/60*    (2006.01)

(52) U.S. Cl.
USPC ............ 257/676; 257/E23.031; 257/668; 257/774; 257/773; 257/778; 257/784; 257/786; 257/737; 257/738; 257/692

(58) Field of Classification Search
USPC ............ 257/668, 774, 773, 778, 784, 786, 257/737, 738, 692, 693, 691, 676, E21.499, 257/E23.031
See application file for complete search history.

(56) References Cited

U.S. PATENT DOCUMENTS

| | | | | |
|---|---|---|---|---|
| 5,357,672 A | * | 10/1994 | Newman | 29/830 |
| 5,399,804 A | * | 3/1995 | Yoneda et al. | 174/530 |
| 5,973,393 A | * | 10/1999 | Chia et al. | 257/690 |
| 6,353,257 B1 | * | 3/2002 | Huang | 257/704 |
| 7,993,981 B2 | * | 8/2011 | Low et al. | 438/124 |
| 2005/0253286 A1 | * | 11/2005 | Yoshikawa et al. | 257/787 |
| 2008/0029860 A1 | * | 2/2008 | Gao | 257/675 |
| 2008/0315382 A1 | * | 12/2008 | Wallace | 257/676 |
| 2009/0189263 A1 | * | 7/2009 | Baba et al. | 257/676 |
| 2009/0315161 A1 | * | 12/2009 | Bayan et al. | 257/666 |
| 2010/0314747 A1 | * | 12/2010 | Low et al. | 257/693 |
| 2011/0260192 A1 | * | 10/2011 | Kwak et al. | 257/98 |
| 2011/0316137 A1 | * | 12/2011 | Nakamura et al. | 257/676 |
| 2012/0080674 A1 | * | 4/2012 | Shimizu et al. | 257/48 |
| 2012/0132938 A1 | * | 5/2012 | Komatsu et al. | 257/89 |
| 2012/0175759 A1 | * | 7/2012 | Baba et al. | 257/676 |

* cited by examiner

*Primary Examiner* — A O Williams

(74) *Attorney, Agent, or Firm* — Lerner, David, Littenberg, Krumholz & Mentlik, LLP

(57) ABSTRACT

A microelectronic assembly can include a microelectronic element and a lead frame having a first unit and a second unit overlying the first unit and assembled therewith. The first unit can have a first metal layer comprising a portion of the thickness of the lead frame and including terminals and first conductive elements extending away therefrom. The second unit can have a second metal layer comprising a portion of the thickness of the lead frame and including bond pads and second conductive elements extending away therefrom. The first and second units each can have an encapsulation supporting at least portions of the respective first and second conductive elements. At least some of the second conductive elements can overlie portions of corresponding ones of the first conductive elements and can be joined thereto. The microelectronic element can have contacts electrically connected with the bond pads of the lead frame.

26 Claims, 5 Drawing Sheets

FIG. 3A
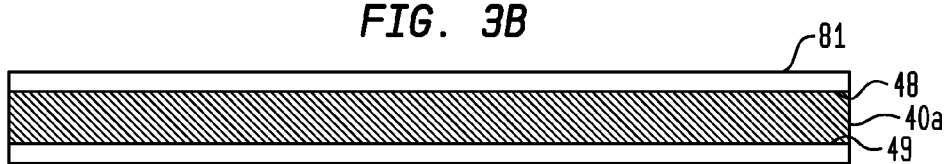
FIG. 3B
FIG. 3C
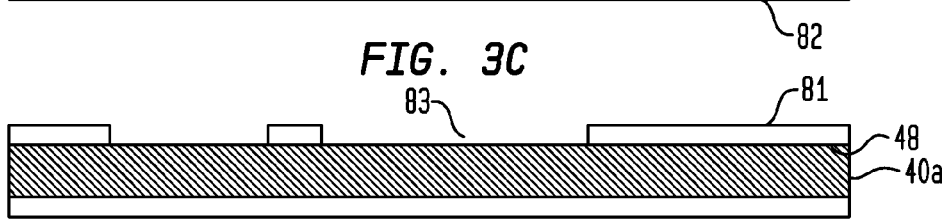
FIG. 3D
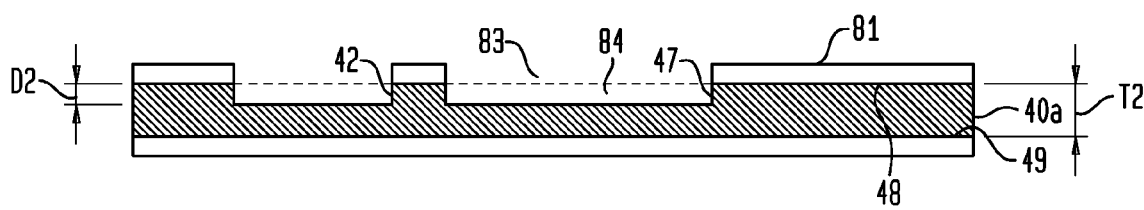
FIG. 3E
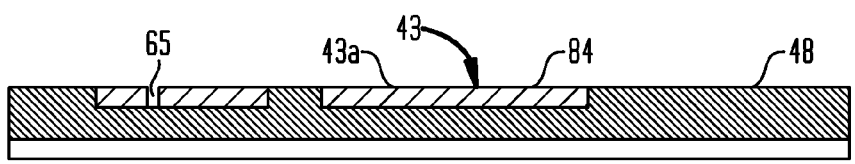
FIG. 3F
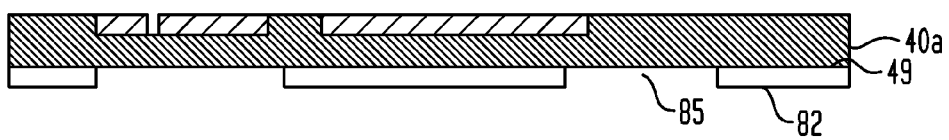
FIG. 3G
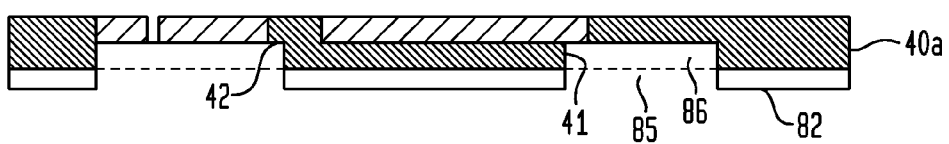
FIG. 3H
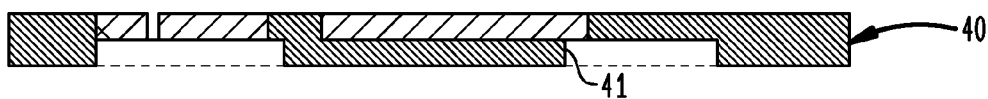

AREA ARRAY QUAD FLAT NO-LEAD (QFN) PACKAGE

BACKGROUND OF THE INVENTION

The present invention relates to microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself.

As used in this disclosure with reference to a flat chip having a front face, the "area of the chip" should be understood as referring to the area of the front face. In "flip chip" designs, the front face of the chip confronts the face of a package substrate, i.e., the chip carrier, and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low overall height or dimension perpendicular to the plane of the circuit panel. Such thin microelectronic packages allow for placement of a circuit panel having the packages mounted therein in close proximity to neighboring structures, thus reducing the overall size of the product incorporating the circuit panel.

Despite the advances that have been made in thin microelectronic packages, there is still a need for improvements in order to minimize the size and improve the performance of such packages. These attributes of the present invention are achieved by the construction of the microelectronic assemblies as described hereinafter.

BRIEF SUMMARY OF THE INVENTION

In accordance with an aspect of the invention, a microelectronic assembly can include a microelectronic element and a lead frame including a first unit and a second unit overlying the first unit and assembled therewith. The first unit can have a first metal layer comprising a portion of the thickness of the lead frame and including terminals and first conductive elements extending away therefrom. The second unit can have a second metal layer comprising a portion of the thickness of the lead frame and including bond pads and second conductive elements extending away therefrom. The first and second units each can have an encapsulation supporting at least portions of the respective first and second conductive elements. At least some of the second conductive elements can overlie portions of corresponding ones of the first conductive elements and can be joined thereto. The microelectronic element can have contacts electrically connected with at least some of the bond pads of the lead frame.

In one embodiment, joints between the first and second conductive elements can include intermetallic regions containing at least one of solder, tin, indium, gold, nickel, platinum, or palladium. In a particular embodiment, the assembly can also include a conductive adhesive joining the first and second conductive elements. In an exemplary embodiment, the first and second metal layers can include respective first and second peripheral conductive elements extending along a periphery of the lead frame, the second peripheral conductive element overlying and joined to the first peripheral conductive element. In one embodiment, the joined first and second peripheral conductive elements together can form a ring extending completely around a periphery of the lead frame.

In a particular embodiment, the joined first and second peripheral conductive elements can each include segments extending partially around a periphery of the lead frame. In an exemplary embodiment, the first and second peripheral conductive elements can be configured to stiffen at least portions of the microelectronic assembly. In one embodiment, the assembly can also include a third encapsulation insulating at least portions of the microelectronic element from at least portions of the second metal layer. A portion of the third encapsulation can extend between inner and outer parts of the joined first and second peripheral conductive elements.

In accordance with another aspect of the invention, a microelectronic assembly can include a microelectronic element and a lead frame including a first unit and a second unit overlying the first unit and assembled therewith through an intermediate assembly disposed between the first and second units. The first unit can have a first metal layer comprising a portion of the thickness of the lead frame and including terminals and first conductive elements extending away therefrom. The second unit can have a second metal layer comprising a portion of the thickness of the lead frame and including bond pads and second conductive elements extending away therefrom. The intermediate assembly can have at least one intermediate metal layer comprising a portion of the thickness of the lead frame and including intermediate conductive elements. The first unit, the second unit, and the intermediate assembly each can have an encapsulation supporting at least portions of the respective first, second, and intermediate conductive elements. At least some of the second conductive elements can overlie portions of corresponding ones of the intermediate conductive elements and can be joined thereto. At least some of the intermediate conductive elements can overlie portions of corresponding ones of the first conductive elements and can be joined thereto. The microelectronic element can have contacts electrically connected with the bond pads of the lead frame.

In an exemplary embodiment, the microelectronic element can embody a plurality of active semiconductor devices therein. In one embodiment, the microelectronic element can have a plurality of passive devices, the passive devices including at least one of capacitors, inductors, or resistors. In a particular embodiment, the assembly can also include a third encapsulation insulating at least portions of the microelectronic element from at least portions of the second metal layer. In an exemplary embodiment, a portion of the third encapsulation can extend within a space between the first and second encapsulations.

In one embodiment, at least some of the terminals can be electrically connected with corresponding ones of the bond pads and can be displaced therefrom in at least one horizontal direction in a horizontal plane parallel to a face of the microelectronic element. In a particular embodiment, the at least one horizontal direction can be a first horizontal direction and a second horizontal direction transverse to the first horizontal direction, the first and second horizontal directions being in the horizontal plane. The at least some of the terminals can be displaced in each of the first and second horizontal direction from the corresponding ones of the bond pads. In an exemplary embodiment, a pattern of the terminals can define an area array. In one embodiment, the microelectronic element can have a face overlying at least some of the terminals.

In a particular embodiment, the microelectronic element can overlie a die attachment pad portion of the second metal layer. In an exemplary embodiment, the die attachment pad portion can overlie at least some of the terminals. In one embodiment, the contacts of the microelectronic element can be connected with the bond pads by wire bonds. In a particular embodiment, the contacts of the microelectronic element can be connected with the bond pads by ribbon bonds. In an exemplary embodiment, the contacts of the microelectronic element can be connected with the bond pads in a flip-chip configuration.

In an exemplary embodiment, the microelectronic element can be a first microelectronic element, and the assembly can also include a second microelectronic element having contacts electrically connected with at least some of the bond pads of the lead frame. In one embodiment, the first and second microelectronic elements can be disposed adjacent to one another in a horizontal direction perpendicular to a direction of the thickness of the lead frame. In a particular embodiment, the second microelectronic element can at least partially overlie the first microelectronic element. In an exemplary embodiment, the contacts of the first and second microelectronic elements can be connected with the bond pads by wire bonds. In one embodiment, the contacts of the first microelectronic element can be connected with the bond pads in a flip-chip configuration, and the contacts of the second microelectronic element can be connected with the bond pads by wire bonds.

Further aspects of the invention can provide systems that incorporate microelectronic assemblies according to the foregoing aspects of the invention, composite chips according to the foregoing aspects of the invention, or both in conjunction with other electronic components electrically connected thereto. For example, the system can be disposed in and/or mounted to a single housing, which can be a portable housing. Systems according to preferred embodiments in this aspect of the invention can be more compact than comparable conventional systems.

In accordance with yet another aspect of the invention, a method of fabricating a microelectronic assembly can include removing material from a first surface of a first metal layer to form one of terminals and first conductive elements having first recesses extending therebetween. The method can also include depositing a first encapsulation into the first recesses. The method can also include removing material from a second surface of the first metal layer opposite the first surface to form another of the terminals and the first conductive elements, thereby forming a first unit including the terminals and the first conductive elements extending away therefrom. The method can also include removing material from a first surface of a second metal layer to form one of bond pads and second conductive elements having second recesses extending therebetween. The method can also include depositing a second encapsulation into the second recesses. The method can also include removing material from a second surface of the second metal layer opposite the first surface to form another of the bond pads and the second conductive elements, thereby forming a second unit including the bond pads and the second conductive elements extending away therefrom. The method can also include joining at least some of the first conductive elements to corresponding ones of the second conductive elements. The method can also include attaching at least one microelectronic element to the second unit and electrically connecting contacts of the at least one microelectronic element with at least some of the bond pads.

In one embodiment, the joining step can be performed by metallurgically joining the at least some of the first conductive elements to the corresponding ones of the second conductive elements. In a particular embodiment, the joining step can include forming intermetallic regions between the at least some of the first conductive elements and the corresponding ones of the second conductive elements, the intermetallic regions containing at least one of solder, tin, indium, gold, nickel, platinum, or palladium. In an exemplary embodiment, the joining step can include a thermocompression process to metallurgically join the at least some of the first conductive elements to the corresponding ones of the second conductive elements.

In a particular embodiment, the joining step can be performed by joining the at least some of the first conductive elements to the corresponding ones of the second conductive elements with a conductive adhesive. In one embodiment, the steps of removing material from the first and second metal layers can include forming respective first and second peripheral conductive elements extending along a periphery of the microelectronic assembly, and the joining step can bond the first and second peripheral conductive elements to one another. In an exemplary embodiment, the method can also include, after the joining step, depositing a third encapsulation insulating at least portions of the microelectronic element from at least portions of the second metal layer, such that a portion of the third encapsulation is deposited between inner and outer parts of the joined first and second peripheral conductive elements.

In accordance with still another aspect of the invention, a method of fabricating a microelectronic assembly can include removing material from a first surface of a first metal layer to form one of terminals and first conductive elements having first recesses extending therebetween. The method can also include depositing a first encapsulation into the first recesses. The method can also include removing material from a second surface of the first metal layer opposite the first surface to form another of the terminals and the first conductive elements, thereby forming a first unit including the terminals and the first conductive elements extending away therefrom. The method can also include removing material from a first surface of a second metal layer to form one of bond pads and second conductive elements having second recesses extending therebetween. The method can also include depositing a second encapsulation into the second recesses. The method can also include removing material from a second surface of the second metal layer opposite the first surface to form another of the bond pads and the second conductive elements, thereby forming a second unit including the bond pads and the second conductive elements extending away therefrom.

The method can also include removing material from a first surface of an intermediate metal layer to form a first set of intermediate conductive elements having intermediate recesses extending therebetween. The method can also include depositing an intermediate encapsulation into the intermediate recesses. The method can also include removing material from a second surface of the intermediate metal layer opposite the first surface to form a second set of intermediate conductive elements, thereby forming an intermediate unit including the first set of intermediate conductive elements and the second set of intermediate conductive elements extending away therefrom. The method can also include joining at least some of the second conductive elements to corresponding ones of the intermediate conductive elements and joining at least some of the intermediate conductive elements to corresponding ones of the first conductive elements. The method can also include attaching at least one microelectronic element to the second unit and electrically connecting contacts of the at least one microelectronic element with at least some of the bond pads.

In an exemplary embodiment, the steps of removing material from the first surface of the first and second metal layers can be performed simultaneously and the steps of removing material from the second surface of the first and second metal layers can be performed simultaneously. In one embodiment, the steps of depositing the first and second encapsulations can be performed before the joining step. In a particular embodiment, the steps of depositing the first and second encapsulations can be performed by at least one of: molding, screen-on, and spin-on. In an exemplary embodiment, the method can also include, after the steps of depositing the first and second encapsulations, revealing at least one of the terminals and the bond pads by performing at least one of: polishing, flame-off, chemical etching, and plasma etching.

In one embodiment, the method can also include depositing a third encapsulation insulating at least portions of the at least one microelectronic element from at least portions of the second metal layer. In a particular embodiment, a portion of the third encapsulation can extend within a space between the first and second encapsulations. In an exemplary embodiment, the electrically connecting step can be performed by wire bonding the contacts of the at least one microelectronic element with the bond pads. In one embodiment, the electrically connecting step can be performed by flip-chip bonding the contacts of the at least one microelectronic element with the bond pads.

In a particular embodiment, the electrically connecting step can be performed by curing a conductive matrix material disposed between the contacts of the at least one microelectronic element and the bond pads. In an exemplary embodiment, the attaching step can include attaching at least two microelectronic elements to the second unit and electrically connecting contacts of each of the at least two microelectronic element with at least some of the bond pads. In one embodiment, the method can also include dicing the microelectronic assembly to form a plurality of microelectronic packages, each microelectronic package including a corresponding one of the microelectronic elements, a portion of the first unit, and a portion of the second unit.

BRIEF DESCRIPTION OF THE DRAWINGS

FIGS. 3A-3H are diagrammatic side sectional views of stages of fabrication of the second unit of the microelectronic assembly of FIG. 1A.

DETAILED DESCRIPTION

Figure 1A:
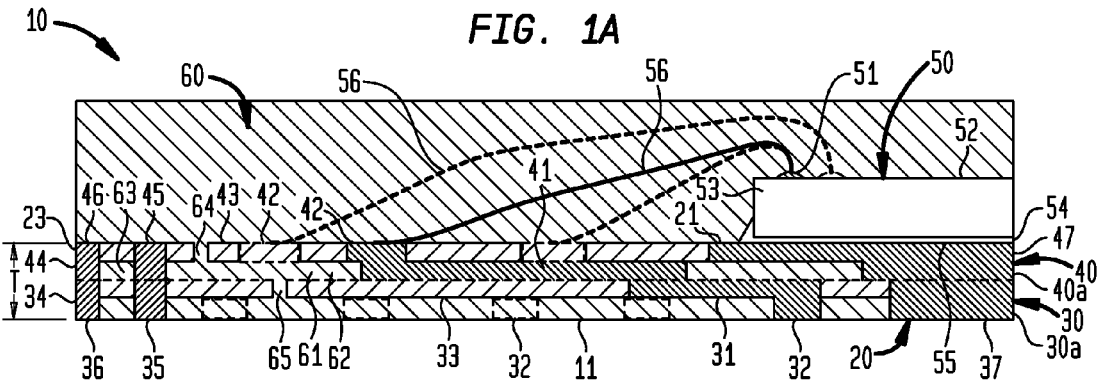
FIG. 1A is a diagrammatic side sectional view of a microelectronic assembly according to an embodiment of the present invention.
Figure 1B:
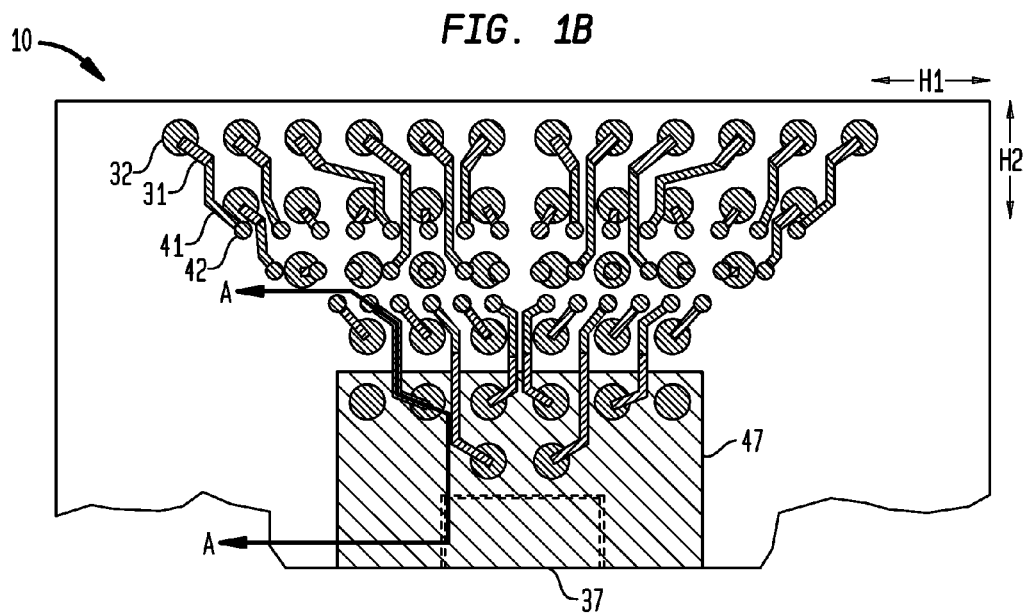
FIG. 1B is a diagrammatic transparent top view that can correspond to a portion of the microelectronic assembly of FIG. 1A.
Figure 1C:
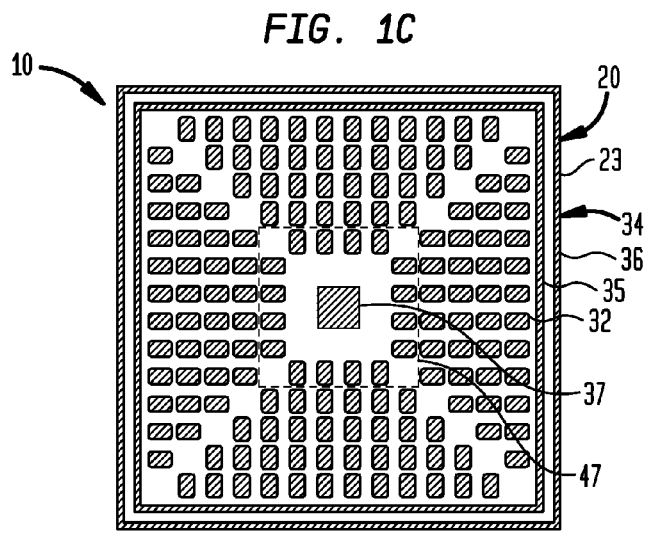
FIG. 1C is a diagrammatic bottom view that can correspond to the microelectronic assembly of FIG. 1A.

With reference to FIGS. 1A-1C, a microelectronic assembly 10 according to an embodiment of the present invention can include a lead frame 20 having a first unit 30, a second unit 40 overlying the first unit and assembled herewith, at least one microelectronic element 50 electrically connected with the lead frame, and an encapsulation 60 insulating at least portions of the microelectronic element from at least portions of the lead frame.

Examples of lead frame structures are shown and described in U.S. Pat. Nos. 7,176,506 and 6,765,287, the disclosures of which are hereby incorporated by reference herein. In general, a lead frame such as the lead frame 20 is a structure formed from a sheet of conductive metal, such as copper, that is patterned into segments including a plurality of conductive elements such as first and second conductive elements 31 and 41. The conductive elements 31 and 41 can then be used to form electrical connections to various other conductive structures for carrying an electronic signal potential to and from the microelectronic element 50. In one example, the microelectronic elements 31 and 41 can be usable to carry an address signal usable to address a memory storage element in the microelectronic element 50.

The first unit 30 can have a first metal layer 30a comprising a first portion of the thickness T of the lead frame. The first metal layer 30a can include electrically conductive terminals 32 and first electrically conductive elements 31 extending away therefrom for interconnection with the second electrically conductive elements 41. The terminals can be exposed at a bottom surface 11 of the microelectronic assembly 10 for electrical interconnection with an external component such as a package substrate or a PCB. In one embodiment, the terminals 32 can have conductive masses attached thereto for electrical interconnection with an external component. The encapsulation 60 can cover remaining portions of the microelectronic assembly 10 that are not configured for electrical connection with one or more components external to the microelectronic assembly. The first unit 30 can also have a first encapsulation 33 supporting at least portions of the first conductive elements 31.

In FIGS. 1A-1C, the directions parallel to the bottom surface 11 of the microelectronic assembly 10 are referred to herein as "horizontal" or "lateral" directions, whereas the directions perpendicular to the bottom surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

The second unit 40 can overlie the first unit 30 and can be assembled therewith. The second unit 40 can have a second metal layer 40a comprising a second portion of the thickness T of the lead frame. The second metal layer 40a can include electrically conductive bond pads 42 and second electrically conductive elements 41 extending away therefrom for interconnection with the first electrically conductive elements 31. The bond pads 42 can be exposed at a top surface 21 of the lead frame 20 for electrical interconnection with the microelectronic element 50. As shown in FIG. 1B, the bond pads 42 can be arranged in a series of parallel rows. The second unit 40 can also have a second encapsulation 44 supporting at least portions of the second conductive elements 41.

In an exemplary embodiment, the first unit 30 and the second unit 40 can be disposed parallel to one another within the microelectronic package 10. As used herein, "parallel" refers to axes extending through the structures' centroids being parallel or substantially parallel within an allowed tolerance, even if edges of the "parallel" structures are not entirely parallel.

As shown in FIG. 1B, at least some of the terminals can be electrically connected with corresponding ones of the bond pads 42 and can be displaced therefrom in at least one horizontal direction in a horizontal plane parallel to a face of the microelectronic element 50 such as the front surface 52. In one example, the at least one horizontal direction can be a first horizontal direction H1 and a second horizontal direction H2 transverse to the first horizontal direction, the first and second horizontal directions being in the horizontal plane. At least some of the terminals 32 can be displaced in each of the first and second horizontal directions H1 and H2 from the corresponding ones of the bond pads 42. As shown in FIG. 1C, a pattern of the terminals 32 can define an area array.

At least some of the second conductive elements 41 can overlie portions of corresponding ones of the first conductive elements 31 and can be joined thereto. In particular examples, joints between the first and second conductive elements 31 and 41 can include intermetallic regions containing at least one of solder, tin, indium, gold, nickel, platinum, palladium, or an alloy of any of these metals. In one embodiment, a conductive adhesive can be used to join corresponding ones of the first and second conductive elements 31 and 41. In a particular embodiment, wherein the first and second conductive elements 31 and 41 are made of copper, a copper-to-copper diffusion bond can join the first and second conductive elements to one another. In one example, the first and second conductive elements 31 and 41 can be joined with a conductive matrix material extending therebetween.

In one embodiment, conductive masses can be used to join corresponding ones of the first and second conductive elements 31 and 41 to one another. Such conductive masses can comprise a fusible metal having a relatively low melting temperature, e.g., solder, tin, or a eutectic mixture including a plurality of metals. Alternatively, the conductive masses can include a wettable metal, e.g., copper or other noble metal or non-noble metal having a melting temperature higher than that of solder or another fusible metal. In a particular embodiment, the conductive masses can include a conductive material interspersed in a medium, e.g., a conductive paste, e.g., metal-filled paste, solder-filled paste or isotropic conductive adhesive or anisotropic conductive adhesive.

As can be seen in FIGS. 1A and 1C, the first and second metal layers 20a and 30a can include respective first and second peripheral conductive elements 34 and 44 extending along a periphery 23 of the lead frame 20. The second peripheral conductive element 44 can overlie and can be joined to the first peripheral conductive element 34 using similar joining mechanisms as described above with reference to the joining of the first and second conductive elements 31 and 41.

In one example, as shown in FIG. 1C, the joined first and second peripheral conductive elements 34 and 44 together can form at least one ring extending completely around the periphery 23 of the lead frame 20. The first and second peripheral conductive elements 34 and 44 can be configured to stiffen at least portions of the microelectronic assembly 10. For example, each of the first and second peripheral conductive elements 34 and 44 can extend partially around the periphery 23 of the lead frame 20, thereby stiffening the portions of the microelectronic assembly 10 through which they extend.

In a particular embodiment, the joined first and second peripheral conductive elements 34 and 44 that together can extend partially or completely around the periphery 23 of the lead frame 20 can carry a power supply or reference voltage. In one example, first and second separate portions of the joined first and second peripheral conductive elements 34 and 44 can each extend partially around the periphery 23 of the lead frame 20. In such an embodiment having first and second separate portions, the first portion of the peripheral conductive elements 34, 44 can carry a power supply, and the second portion can carry a reference voltage. In another example, each of the first and second separate portions of the peripheral conductive elements 34, 44 can carry a different voltage.

In such embodiments wherein at least a portion of the joined first and second peripheral conductive elements 34 and 44 are configured to carry a power supply, a reference voltage, or another voltage, one or more of the first and second conductive elements 31, 41 can extend to the portions of the peripheral conductive elements 34 and/or 44 to provide an electrical connection between the microelectronic element and the power supply, reference voltage, and/or other voltages.

In a particular embodiment, each of the first and second peripheral conductive elements 34 and 44 can include respective inner parts 35 and 45 and respective outer parts 36 and 46. In one example, each of the inner parts 35 and 45 and the outer parts 36 and 46 of the first and second peripheral conductive elements 34 and 44 can form a complete ring extending around the periphery 23 of the lead frame 20.

In an exemplary embodiment, the lead frame 20 can include at least one intermediate assembly (not shown) disposed between the first and second units 30 and 40. The first and second units 30 and 40 can be assembled to one another through at least one intermediate assembly. Each intermediate assembly can have at least one intermediate metal layer comprising a portion of the thickness T of the lead frame 20.

Such an intermediate metal layer can include intermediate conductive elements, and the intermediate assembly can have an intermediate encapsulation supporting at least portions of the intermediate conductive elements. In such an embodiment, at least some of the second conductive elements 41 can overlie portions of corresponding ones of the intermediate conductive elements and can be joined thereto, and at least some of the intermediate conductive elements can overlie portions of corresponding ones of the first conductive elements 31 and can be joined thereto.

The microelectronic element 50 can be a semiconductor chip, a wafer, or the like. For example, the microelectronic element 50 can include a memory storage element such as a DRAM. As used herein, a "memory storage element" refers to a multiplicity of memory cells arranged in an array, together with circuitry usable to store and retrieve data therefrom, such as for transport of the data over an electrical interface. Although a single microelectronic element 50 is shown in the embodiment of FIGS. 1A through 4B, the microelectronic assembly 10 can include a plurality of stacked and/or adjacent microelectronic elements, such as shown and described below with reference to FIGS. 6-8.

The microelectronic element 50 can be a device chip having a plurality of at least one of passive devices or active devices. In one example, the microelectronic element can embody a plurality of active semiconductor devices therein. In another example, the microelectronic element device chips 50 can have a plurality of passive devices, the passive devices including at least one of capacitors, inductors, or resistors.

Each microelectronic element 50 can include electrically conductive contacts 51 exposed at the front surface 52 thereof. As described herein, the electrically conductive contacts 51 of microelectronic element 50 can also be referred to as "chip contacts." The contacts 51 of the microelectronic element 50 can be exposed at the front surface adjacent a peripheral edge 53 of the microelectronic element. For example, the contacts 51 can be arranged in rows adjacent the peripheral edges 53 of the front surface 51.

As shown in FIG. 1A, the contacts 51 of the microelectronic element 50 can be electrically connected with corresponding ones of the bond pads 42 of the lead frame 20 by wire bonds 56 extending therebetween. In a particular example, the contacts 51 of the microelectronic element 50 can be connected with corresponding ones of the bond pads 42 by ribbon bonds extending therebetween.

In an alternative embodiment (such as that shown in FIG. 6), the microelectronic element 50 can be connected with the bond pads 42 in a flip-chip configuration. In such an embodiment, the microelectronic element 50 can be oriented such that the front surface 52 confronts the lead frame 20. In such an example, at least some of the bond pads 42 can underlie contacts exposed at the front surface 52 of the microelectronic element 50, and metal bumps and/or metal posts can join the bond pads and the contacts.

In one example, the microelectronic element 50 can overlie a die attachment pad portion 47 of the second metal layer 40a. Such a die attachment pad portion 47 can overlie at least some of the terminals 32, such that at least some of the contacts 51 of the microelectronic element 50 can be electrically connected to terminals that underlie the microelectronic element. The microelectronic element 50 can be attached to the die attachment pad portion 47 with, for example, an adhesive 54 extending between a rear surface 55 of the microelectronic element and the die attachment pad portion. In one example, the microelectronic element 50 can have a face such as the front surface 52 overlying at least some of the terminals 32.

The encapsulation 60 can cover the microelectronic element 50 and the top surface 21 of the lead frame 20. The encapsulation 60 can cover, for example, the front surface 52 of the microelectronic element 50. In a particular embodiment, the encapsulation 60 can be an overmold. The encapsulation can insulate at least portions of the microelectronic element 50 from at least portions of the second metal layer 40a. In one example, as shown in FIG. 1A, a portion 63 of the encapsulation 60 can extend between the inner parts 35, 45 and the outer parts 36, 46 of the respective first and second peripheral conductive elements 35, 45, thereby providing a peripheral interlocking feature that can help join the first unit 30 and the second unit 40 to one another. In an exemplary embodiment, a portion of the encapsulation 60 can extend within a space 62 between the first and second encapsulations 33 and 43. In such an embodiment, the encapsulation 60 can help join the first unit 30 and the second unit 40 to one another.

A method of fabricating the microelectronic unit 10 (FIGS. 1A-1C) will now be described, with reference to FIGS. 2A through 3H. FIGS. 2A-2H show stages of fabrication of the first unit 30, while FIGS. 3A-3H show corresponding stages of fabrication of the second unit 40. Fabrication of the first unit 30 can be formed simultaneously with fabrication of the second unit 40, for example, on different sections of a single assembly, or the first and second units can be formed separately in series.

Figure 2A:
FIGS. 2A-2H are diagrammatic side sectional views of stages of fabrication of the first unit of the microelectronic assembly of FIG. 1A.

As shown in FIGS. 2A and 3A, a first metal layer 30a and a second metal layer 40a can be provided. The first and second metal layers 30a and 40a can be made of copper, for example.

Figure 2B:
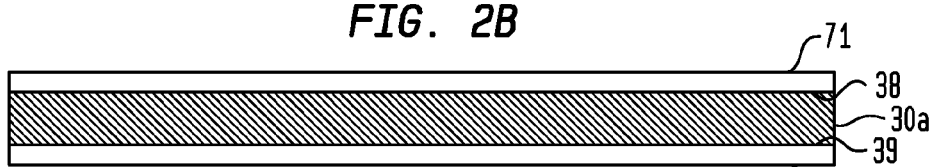

In FIGS. 2B and 3B, mask layers 71 and 72 can be formed overlying respective first and second surfaces 38 and 39 of the first metal layer 30a, and mask layers 81 and 82 can be deposited overlying respective first and second surfaces 48 and 49 of the second metal layer 40a. For example, the mask layers 71, 72, 81, and 82 can be photoimageable layers such as photoresist layers.

Figure 2C:
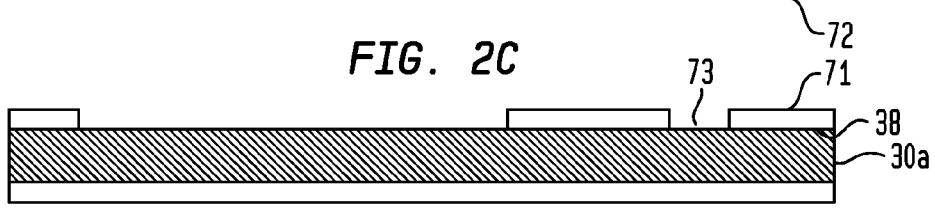

FIGS. 2C and 3C show selective development of the mask layers 71 and 81 that coat the respective first surfaces 38 and 48 of the first and second metal layers 30a and 40a to form respective resist openings 73 and 83. Although FIGS. 2A through 3H show the first surfaces 38 and 48 of the first and second metal layers 30a and 40 being processed first, in an alternate embodiment, the respective second surfaces 39 and 49 can be processed first. Portions of the mask layers 71 and 81 are preserved where it is desired to preserve remaining portions of the metal layers 30a and 40a for formation of conductive features at the respective first surfaces 38 and 48.

Figure 2D:
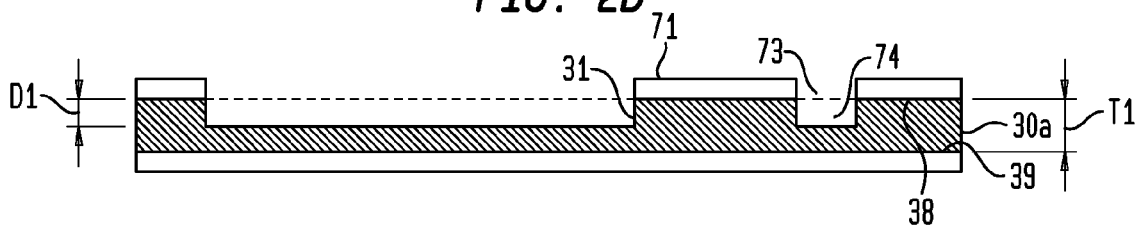
Figure 2E:
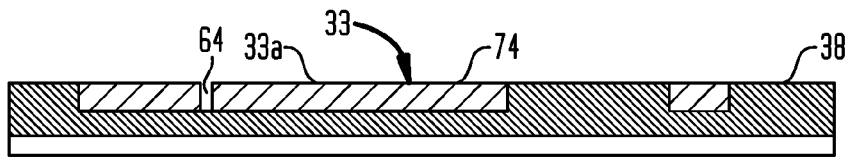

First recesses 74 can be formed extending downward from the first surface 38 of the first metal layer 30a, for example, by selectively etching the first metal layer at the resist openings 73 to remove material from the first surface of the first metal layer, as shown in FIG. 2D. Correspondingly, second recesses 84 can be formed extending downward from the first surface 48 of the second metal layer 40a, for example, by selectively etching the second metal layer 40a at the resist openings 83 to remove material from the first surface of the second metal layer, as shown in FIG. 3D.

In one example, a timed etch process can be used to form the first and second recesses 74 and 84. The first recesses 74 can be formed extending to a depth D1 below the first surface 38 towards the second surface 39, and the second recesses 84 can be formed extending to a depth D2 below the first surface 48 towards the second surface 49. In a particular embodiment, the depths D1 and D2 can be approximately half of the respective thickness T1 and T2 of the first and second metal layers 30a and 40a.

As shown in FIG. 2D, the removal of material from the first surface 38 of the first metal layer 30a can form the first electrically conductive elements 31 at the first surface having the first recesses 74 extending therebetween. As shown in FIG. 3D, the removal of material from the first surface 48 of the second metal layer 40a can form the electrically conductive bond pads 42 at the first surface having the second recesses 84 extending therebetween. The removal of material from the first surface 48 of the second metal layer 40a can also form the die attachment pad portion 47 at the first surface. Although the figures show the first electrically conductive elements 31 and the conductive bond pads 42 being formed first, in an alternative embodiment, the terminals 32 and/or the second electrically conductive elements 41 can be formed first. After the conductive elements 31 and the conductive bond pads 42 have been formed, the remaining portions of the mask layers 71 and 81 can be removed.

Figure 2F:
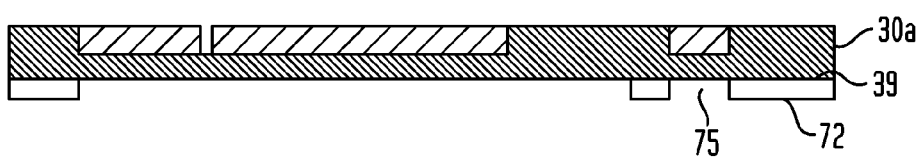
Figure 2G:
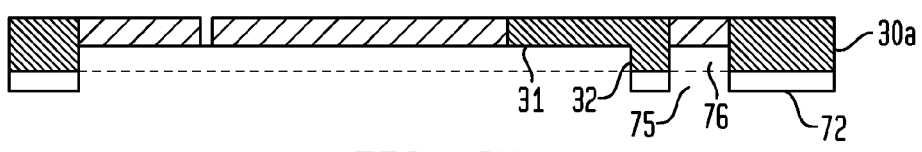
Figure 2H:
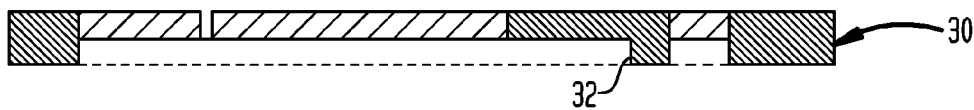

As shown in FIGS. 2H and 3H, a first encapsulation and a second encapsulation 43 can be injected into the respective first and second recesses 74 and 84. In one example, the first and second encapsulations 33 and 43 can completely fill the respective first and second recesses 74 and 84. In a particular embodiment, the first encapsulations 33 can extend between adjacent ones of the first conductive elements 31, and the second encapsulations 43 can extend between adjacent ones of the bond pads 42. In an exemplary embodiment, the first and second encapsulations 33 and 43 can be formed with respective channels 64 and 65 extending completely through the respective depths D1 and D2 of the first and second recesses 74 and 84. Such channels 64, 65 can be formed, for example, by inserting pins into particular locations within the first and second recesses 74, 84 during the injection of the first and second encapsulations 33, 43 to prevent the encapsulation material from flowing into the channels. In another embodiment, the channels 64, 65 can be formed after the injection of the encapsulations 33, 43, by a laser, for example.

Figure 4A:
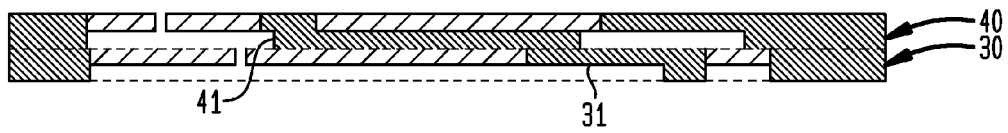
FIGS. 4A and 4B are diagrammatic side sectional views of stages of fabrication of the joined first unit of FIG. 2H and second unit of FIG. 3H.

As shown in the figures, the steps of depositing the first and second encapsulations 33 and 43 into the respective first and second recesses 74 and 84 can be performed before the first and second units 30 and 40 are joined with one another (FIG. 4A). In one example, the steps of depositing the first and second encapsulations 33 and 43 into the respective first and second recesses 74 and 84 can be performed by at least one of: molding, screen-on, and spin-on.

In an exemplary embodiment, the first surfaces 38 and 48 of the respective first and second metal layers 30a and 40a can be processed so that upper surfaces 33a and 43a of the first and second encapsulations 33 and 43 can be planarized with the first surfaces of the first and second metal layers, thereby exposing the bond pads 42 for interconnection with the microelectronic element 50 and/or exposing the first conductive elements 31 for interconnection with the second conductive elements 41. Such processing of the upper surfaces 33a and 43a of the first and second encapsulations 33 and 43 can be performed by at least one of: polishing, flame-off, chemical etching, and plasma etching.

In an alternative embodiment wherein the terminals and/or the second conductive elements 41 are located adjacent the upper surfaces 33a and 43a of the first and second encapsulations 33 and 43 (not shown), similar processing as that described above can be applied to the upper surfaces of the first and second encapsulations to expose the terminals 32 for interconnection with an external component and/or to expose the second conductive elements 41 for interconnection with the first conductive elements 31.

FIGS. 2F and 3F show selective development of the mask layers 72 and 82 that coat the respective second surfaces 39 and 49 of the first and second metal layers 30a and 40a to form respective resist openings 75 and 85. Portions of the mask layers 72 and 82 are preserved where it is desired to preserve remaining portions of the metal layers 30a and 40a for formation of conductive features at the respective second surfaces 39 and 49.

Third recesses 76 can be formed extending downward from the second surface 39 of the first metal layer 30a, for example, by selectively etching the first metal layer at the resist openings 75 to remove material from the second surface of the first metal layer, as shown in FIG. 2G. Correspondingly, second recesses 86 can be formed extending downward from the second surface 49 of the second metal layer 40a, for example, by selectively etching the second metal layer 40a at the resist openings 85 to remove material from the second surface of the second metal layer, as shown in FIG. 3G.

The third and fourth recesses 76 and 86 can be formed using the same processes described above with respect to FIGS. 2D and 3D. The third recesses 76 can be formed extending through the remaining depth of the first metal layer 30a such that at least some of the third recesses join at least some of the first recesses, and the fourth recesses 86 can be formed extending through the remaining depth of the second metal layer 40a such that at least some of the fourth recesses join at least some of the second recesses.

As shown in FIG. 2G, the removal of material from the second surface 39 of the first metal layer 30a can form the conductive terminals 32 at the second surface having the third recesses 76 extending therebetween. At least some of the conductive terminals 32 can be formed extending from corresponding ones of the first conductive elements 31. As shown in FIG. 3G, the removal of material from the second surface 49 of the second metal layer 40a can form the second electrically conductive elements 41 at the second surface having the fourth recesses 86 extending therebetween. At least some of the second conductive elements 41 can be formed extending from corresponding ones of the bond pads 42.

After the terminals 32 and the second conductive elements 41 have been formed, the remaining portions of the mask layers 72 and 82 can be removed, thereby completing formation of the first unit 30 and the second unit 40, as shown in FIGS. 2H and 3H.

Although the first and second peripheral conductive elements 34 and 44 from FIGS. 1A-1C are not shown in FIGS. 2A through 3H, the first and second peripheral conductive elements can be formed simultaneously with the first and second conductive elements 31 and 41, the terminals 32, and the bond pads 42, using similar processes as those described above with reference to FIGS. 2A through 3H.

Subsequently, as shown in FIG. 4A, the first unit 30 and the second unit 40 can be joined to one another such that at least some of the first conductive elements 31 are joined to corresponding ones of the second conductive elements 41.

In one embodiment, the joining of the first and second units 30 and 40 to one another can be performed by metallurgically joining at least some of the first conductive elements 31 to corresponding ones of the second conductive elements 41. In such an embodiment, the joining of the first and second units 30 and 40 can be performed by forming intermetallic regions between at least some of the first conductive elements 31 and corresponding ones of the second conductive elements 41, the intermetallic regions containing at least one of solder, tin, indium, gold, nickel, platinum, or palladium.

In another example, the joining of the first and second units 30 and 40 can be performed by a thermocompression process that can metallurgically join at least some of the first conductive elements 31 to corresponding ones of the second conductive elements 41. In a particular embodiment, the joining of the first and second units 30 and 40 can be performed by joining at least some of the first conductive elements 31 to corresponding ones of the second conductive elements 41 with a conductive adhesive.

In another example, the joining of the first and second units 30 and 40 can be performed by depositing a conductive matrix material extending between at least some of the first conductive elements 31 and corresponding ones of the second conductive elements 41. In a subsequent sintering process, the lead frame 20 can be heated to a sintering temperature in which the conductive matrix material undergoes changes which then permanently electrically and mechanically joins the first and second conductive elements 31 and 41 to one another.

As deposited, i.e., before sintering, the conductive matrix material can include particles or flakes of a high melting-point material such as copper or silver, and particles or flakes a low melting-point material, such as tin, bismuth, or a combination of tin and bismuth. Some particles may have a structure which includes metal or non-metal cores, for example, polymer, silica or graphite cores, and a different metal such as a low melting-point metal thereon.

In some examples, the conductive matrix material may include a "reactive" or uncured polymer. After deposition, the structure can be subsequently heated to a temperature for sintering the conductive matrix material. During this sintering process, the high and low melting point metals fuse together, typically forming intermetallics therebetween, and forming a solid matrix of metal which can have an open cell foam-like appearance. The deposited conductive matrix material may include a medium which escapes from the metallic component thereof during the sintering process, such as by evaporation, such that the conductive matrix material may have voids therein. Alternatively, the conductive matrix material may include a reactive polymer component. Typically, the polymer component cross-links and cures as a result of the sintering process. The polymer component can become interspersed throughout the metal matrix as a result of the sintering process, the polymer material typically being connected together in open cells of the metal matrix. The metal matrix and polymer interspersed throughout may then form a solid conductive structure.

Under certain conditions, after sintering, the conductive matrix material can form a solid structure which subsequently cannot be reflowed except at a temperature substantially higher than the temperature at which the sintering process is performed. Such result may be obtained by sintering particularly when a low melting-point metal, e.g., tin or bismuth, is substantially consumed in the formation of intermetallics with at least one other metal component, of the conductive material, e.g., copper.

Depending upon the application, the temperature at which the conductive matrix material is sintered can be substantially lower than a reflow temperature at which alternative connections made of solder would need to be formed. Metals such as copper or silver can be added to solder to improve mechanical resilience and to increase the melting temperature of the solder. Thus, the structure of the bonds between the first and second conductive elements 31 and 41 that have been formed with a conductive matrix material may provide a more mechanically robust system with a lower joining temperature than corresponding solder connections.

In such case, use of such conductive matrix material can help to avoid problems associated with higher temperature joining processes. For example, lower temperature joining processes achieved using a conductive matrix material can help avoid undesirable changes in substrates which include organic materials whose glass transition temperatures are relatively low. Also, lower temperature joining processes may help to address concerns during such joining processes relating to differential thermal expansion of the lead frame 20 relative to the microelectronic element 50. In this case, a lower temperature joining process can lead to improved package reliability since reduced thermal excursion during the joining process can lead to less stresses being locked into the assembled microelectronic assembly 10.

In a particular example, the conductive matrix material may include a fluxing component as deposited. The fluxing component can assist in removing oxidation byproducts during the sintering process. In one embodiment, the joining process can be conducted using a conductive matrix material that does not have a fluxing component. In such case, the joining process may be performed in a low pressure, e.g., partial vacuum, environment, or one in which oxygen has been evacuated or replaced with another gas.

In an exemplary embodiment where the lead frame 20 includes at least one intermediate assembly (not shown) disposed between the first and second units 30 and 40, the first and second units 30 and 40 can be assembled to one another through at least one intermediate assembly, during the assembly step described above with reference to FIG. 4A. In such an embodiment, at least some of the second conductive elements 41 can overlie portions of corresponding ones of the intermediate conductive elements and can be joined thereto, and at least some of the intermediate conductive elements can overlie portions of corresponding ones of the first conductive elements 31 and can be joined thereto.

Figure 4B:
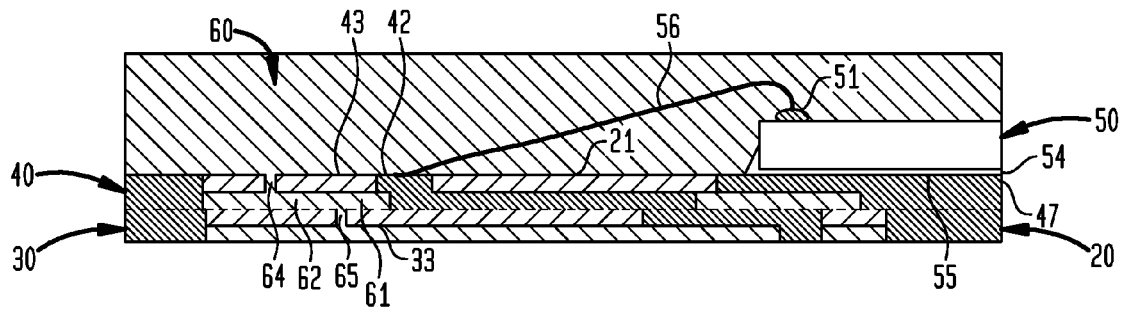

Next, as shown in FIG. 4B, at least one microelectronic unit 50 can be attached to the second unit 40, and contacts 51 of the at least one microelectronic unit can be electrically connected with corresponding ones of the bond pads 42. The microelectronic element 50 can be attached to the die attachment pad portion 47 with, for example, an adhesive 54 extending between a rear surface 55 of the microelectronic element and the die attachment pad portion.

As shown in FIG. 4B, the contacts 51 of the microelectronic element 50 can be electrically connected with corresponding ones of the bond pads 42 of the lead frame 20 by wire bonds 56 extending therebetween. In a particular example, the contacts 51 of the microelectronic element 50 can be connected with corresponding ones of the bond pads 42 by curing a conductive matrix material disposed between the contacts of the microelectronic element and the bond pads.

Although FIGS. 4A and 4B show that the first and second units 30 and 40 can be joined to one another before the microelectronic element 50 is attached to the lead frame 20, in an alternate embodiment (not shown), the microelectronic element can be attached to the second unit before it is joined to the first unit, and then, the second unit with the attached microelectronic element can subsequently be joined with the first unit.

After the microelectronic element 50 is attached to the lead frame 20, the encapsulation 60 can be deposited onto the microelectronic element and the lead frame. The encapsulation 60 can cover the microelectronic element 50 and the top surface 21 of the lead frame 20. As shown in FIG. 4B, portions 61 of the encapsulation 60 can extend within spaces 62 between the first and second encapsulations 33 and 43. In an exemplary embodiment, the portions 61 of the encapsulation 60 that extend with the spaces 62 can reach such spaces by flowing through the channels 64 and/or 65 that extend through the respective first and second encapsulations 33, 43. In one example, vacuum pressure can be applied to the microelectronic assembly 10 while it is in a mold, to facilitate flowing of a mold compound of the encapsulation 60 through the channels 64, and into the spaces 62 between the first and second encapsulations 33 and 43. The encapsulation 60 can help join the first unit 30 and the second unit 40 to one another by flowing into such spaces 62.

Figure 5:
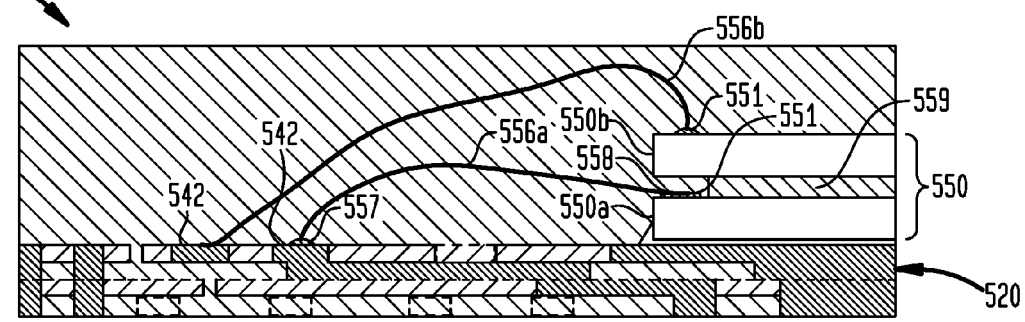
FIG. 5 is a diagrammatic top view of a stage of fabrication of the microelectronic unit of FIG. 1A, showing a plurality of microelectronic assemblies before they are diced into individual packages.

FIG. 5 shows a variation of the embodiment described above with respect to FIGS. 1A through 4B. The microelectronic assembly 510 is the same as the microelectronic unit 10 described above, except that the microelectronic assembly 510 includes a stacked plurality of microelectronic elements 550 electrically connected with the lead frame 520. As shown in FIG. 5, the contacts 551 of a first microelectronic element 550a can be electrically connected with corresponding ones of the bond pads 542 of the lead frame 520 by reverse wire bonds 556a extending therebetween. In such an embodiment, the ball bond portion 557 of the wire bond 556a can be located at the bond pads 542, and the wedge bond portion 558 of the wire bond can be located at the contacts 551. Examples of reverse wire bond configurations that can be used in the microelectronic assembly 510 are described in the co-owned U.S. Pat. No. 6,593,664, which is hereby incorporated by reference herein.

A second microelectronic element 550b can at least partially overlie the first microelectronic element 550a. A spacer 559 can extend between the first and second microelectronic elements 550a, 550b to provide enough clearance between the microelectronic elements for the wedge bond portion 558 of the reverse wire bonds 556a. The contacts 551 of the second microelectronic element 550b can be electrically connected with corresponding ones of the bond pads 542 of the lead frame 520 by wire bonds 556b extending therebetween.

Figure 6:
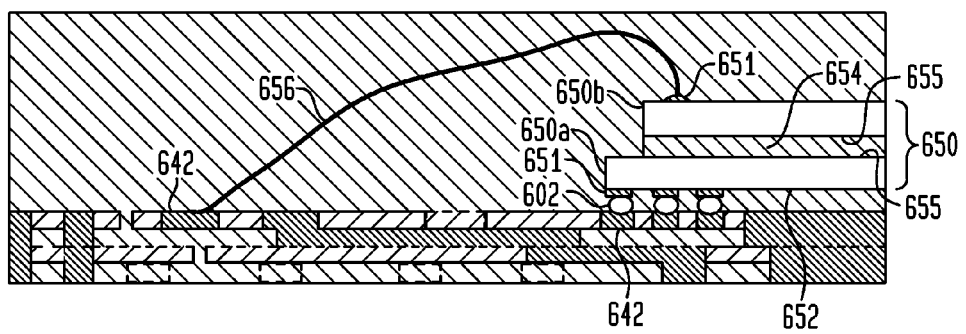
FIG. 6 is a diagrammatic side sectional view of a microelectronic assembly according to another embodiment having a plurality of stacked microelectronic elements.

FIG. 6 shows another variation of the embodiment described above with respect to FIGS. 1A through 4B. The microelectronic assembly 610 is the same as the microelectronic unit 10 described above, except that the microelectronic assembly 610 includes a stacked plurality of microelectronic elements 650 electrically connected with the lead frame 620. As shown in FIG. 6, the contacts 651 of a first microelectronic element 650a can be flip-chip bonded with corresponding ones of the bond pads 642 of the lead frame 620 by conductive masses 602 extending therebetween. Such conductive masses 602 can comprise a fusible metal having a relatively low melting temperature, e.g., solder, tin, or the conductive masses can be any of the other materials described above with reference to the joining of the first and second conductive elements 31, 41. In such an embodiment, the bond pads 642 to which the contacts 651 of the first microelectronic element 650a are flip-chip bonded can underlie the front surface 652 of the first microelectronic element.

A second microelectronic element 650b can at least partially overlie the first microelectronic element 650a. A die attachment adhesive 654 can extend between rear surfaces 655 of the first and second microelectronic elements 650a, 650b. The contacts 651 of the second microelectronic element 650b can be electrically connected with corresponding ones of the bond pads 642 of the lead frame 620 by wire bonds 656 extending therebetween.

Figure 7:
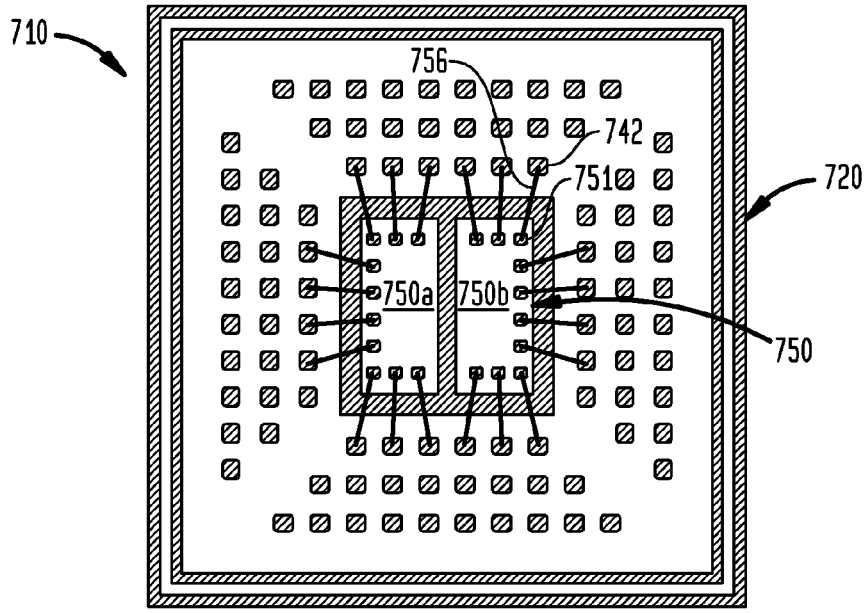
FIG. 7 is a diagrammatic side sectional view of a microelectronic assembly according to yet another embodiment having a plurality of stacked microelectronic elements.

FIG. 7 shows another variation of the embodiment described above with respect to FIGS. 1A through 4B. The microelectronic assembly 710 is the same as the microelectronic unit 10 described above, except that the microelectronic assembly 710 includes a plurality of microelectronic elements 750 disposed adjacent one another and electrically connected with the lead frame 720. In a particular example, the first and second microelectronic elements 750a and 750b can be disposed adjacent to one another in a horizontal direction H1 perpendicular to a direction of the thickness of the lead frame 720. As shown in FIG. 7, the contacts 751 of first and second microelectronic elements 750a, 750b can be electrically connected with corresponding ones of the bond pads 742 of the lead frame 720 by wire bonds 756 extending therebetween.

Figure 8:
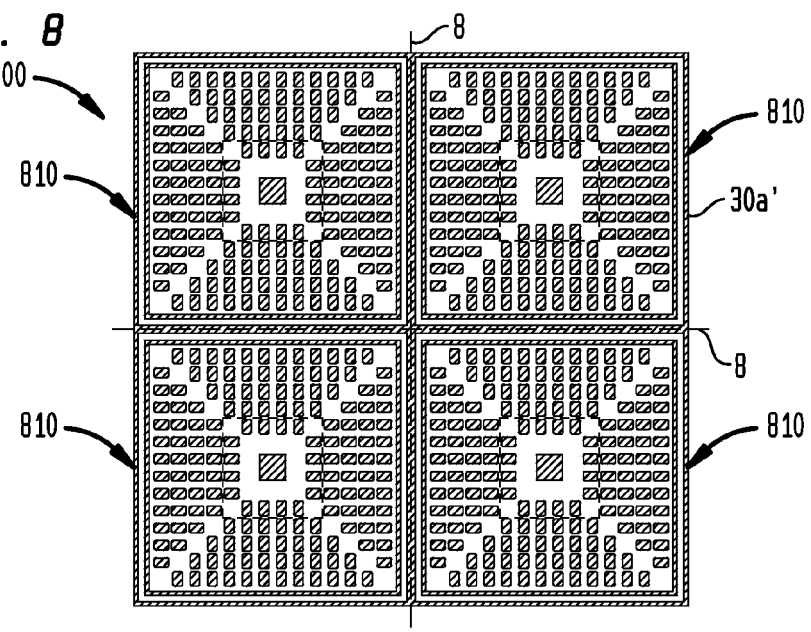
FIG. 8 is a diagrammatic side sectional view of a microelectronic assembly according to still another embodiment having a plurality of adjacent microelectronic elements.

FIG. 8 shows a variation of the embodiments described above, in which a plurality of microelectronic packages are formed together and then diced apart to form individual microelectronic packages. In this variation, a microelectronic assembly 800 includes a plurality of microelectronic packages 810, each package being any of the microelectronic assemblies described above that are fabricated together using a single first metal layer and a single second metal layer. When the fabrication of the microelectronic assembly 800 is complete, the microelectronic assembly 800 can be diced along dicing lanes 8 so as to form individual microelectronic packages 810. Each microelectronic package 810 can include at least one microelectronic element, a portion of the first unit, and a portion of the second unit.

Figure 9:
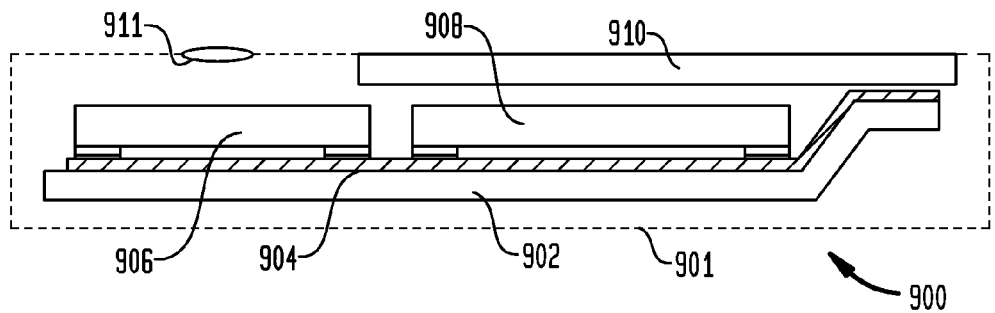
FIG. 9 is a schematic depiction of a system according to one embodiment including a plurality of modules.

The microelectronic units and lead frames described above with reference to FIGS. 1A through 8 can be utilized in construction of diverse electronic systems, such as the system 900 shown in FIG. 9. For example, the system 900 in accordance with a further embodiment of the invention includes a structure 906 as described above in conjunction with other electronic components 908 and 910. The structure 906 as described above may be, for example, a microelectronic assembly 10 as discussed above in connection with FIGS. 1A-1C, or a structure incorporating plural microelectronic assemblies 10. In a further variant, both may be provided, and any number of such structures may be used.

In the exemplary system 900 shown, the system can include a circuit panel or motherboard 902 such as a flexible printed circuit board, and the circuit panel can include numerous conductors 904, of which only one is depicted in FIG. 9, interconnecting the components with one another. However, this is merely exemplary; any suitable structure for making electrical connections can be used.

In a particular embodiment, the system 900 can also include a processor such as the semiconductor chip 908, such that each structure 906 can be configured to transfer a number N of data bits in parallel in a clock cycle, and the processor can be configured to transfer a number M of data bits in parallel in a clock cycle, M being greater than or equal to N.

In the example depicted in FIG. 9, the component 908 is a semiconductor chip and component 910 is a display screen, but any other components can be used in the system 900. Of course, although only two additional components 908 and 910 are depicted in FIG. 9 for clarity of illustration, the system 900 can include any number of such components.

The structure 906 and the components 908 and 910 can be mounted in a common housing 901, schematically depicted in broken lines, and can be electrically interconnected with one another as necessary to form the desired circuit. The housing

901 is depicted as a portable housing of the type usable, for example, in a cellular telephone or personal digital assistant, and screen 910 can be exposed at the surface of the housing. In embodiments where a structure 906 includes a light-sensitive element such as an imaging chip, a lens 911 or other optical device also can be provided for routing light to the structure. Again, the simplified system shown in FIG. 9 is merely exemplary; other systems, including systems commonly regarded as fixed structures, such as desktop computers, routers and the like can be made using the structures discussed above.

A possible benefit of a microelectronic assembly according to the invention, for example the microelectronic assembly 10 described above with reference to FIGS. 1A-1C, whereby the microelectronic element overlies at least some of the terminals, can be to provide relatively short leads. Parasitic capacitance can be considerable between adjacent leads, particularly in microelectronic assemblies that have high contact density and fine pitch. In microelectronic assemblies such as the microelectronic assembly 10 where the leads can be relatively short, parasitic capacitance can be reduced, particularly between adjacent leads.

Another possible benefit of a module or component according to the invention as described above can be to provide similar lengths of conductive leads, for example, which can electrically connect data input/output signal terminals with electrical contacts at the front surfaces of a microelectronic element. In systems such as the system 1300 that can include a plurality of structures 1306, having relatively similar-length leads can allow the propagation delay for data input/output signals between each microelectronic element and exposed terminals to be relatively closely matched.

In any or all of the assemblies, modules, or components described in the foregoing, a surface of the microelectronic element and/or a surface of the lead frame (e.g., a surface of the first and second peripheral conductive elements 34 and 44 extending along a periphery 23 of the lead frame 20) can be at least partially exposed at an exterior surface of the microelectronic assembly after completing fabrication. Such exposed surfaces can be partially or fully exposed although an overmold such as the encapsulation 60, or other encapsulating or packaging structures can contact or be disposed adjacent the exposed surfaces.

In any of the embodiments described above, the microelectronic assembly may include one or more heat spreaders made of metal, graphite or any other suitable thermally conductive material.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
    a lead frame including a first unit and a second unit overlying the first unit and assembled therewith,
    the first unit having a first metal layer comprising a portion of the thickness of the lead frame and including terminals and first conductive elements extending away therefrom, the first unit having a first encapsulation supporting at least portions of the first conductive elements, the terminals exposed at a surface of the first encapsulant and configured for connection with a component external to the microelectronic assembly,
    the second unit having a second metal layer comprising a portion of the thickness of the lead frame and including bond pads and second conductive elements extending away therefrom, the second unit having a second encapsulation supporting at least portions of the second conductive elements,
    at least some of the second conductive elements overlying portions of corresponding ones of the first conductive elements and being joined thereto; and
    a microelectronic element having contacts electrically connected with at least some of the bond pads of the lead frame, the microelectronic element overlying a die attachment pad portion of the second metal layer, the die attachment pad portion overlying at least some of the terminals, the die attachment pad portions being electrically insulated from the terminals by the first and second encapsulations.

2. The microelectronic assembly as claimed in claim 1, wherein joints between the first and second conductive elements include intermetallic regions containing at least one of solder, tin, indium, gold, nickel, platinum, or palladium.

3. The microelectronic assembly as claimed in claim 1, further comprising a conductive adhesive joining the first and second conductive elements.

4. The microelectronic assembly as claimed in claim 1, wherein the first and second metal layers include respective first and second peripheral conductive elements extending along a periphery of the lead frame, the second peripheral conductive element overlying and joined to the first peripheral conductive element.

5. The microelectronic assembly as claimed in claim 4, wherein the joined first and second peripheral conductive elements together form a ring extending completely around a periphery of the lead frame.

6. The microelectronic assembly as claimed in claim 4, wherein the joined first and second peripheral conductive elements each include segments extending partially around a periphery of the lead frame.

7. The microelectronic assembly as claimed in claim 4, wherein the first and second peripheral conductive elements are configured to stiffen at least portions of the microelectronic assembly.

8. The microelectronic assembly as claimed in claim 4, further comprising a third encapsulation insulating at least portions of the microelectronic element from at least portions of the second metal layer, wherein a portion of the third encapsulation extends between inner and outer parts of the joined first and second peripheral conductive elements.

9. A microelectronic assembly, comprising:
    a lead frame including a first unit and a second unit overlying the first unit and assembled therewith through an intermediate assembly disposed between the first and second units,
    the first unit having a first metal layer comprising a portion of the thickness of the lead frame and including terminals and first conductive elements extending away therefrom, the first unit having a first encapsulation supporting at least portions of the first conductive elements, the terminals exposed at a surface of the first encapsulant and configured for connection with a component external to the microelectronic assembly, the second unit having a second metal layer comprising a portion of the thickness of the lead frame and including bond pads and second conductive elements extending away therefrom, the second unit having a second encapsulation supporting at least portions of the second conductive elements, the intermediate assembly having at least one intermediate metal layer comprising a portion of the thickness of the lead frame and including intermediate conductive elements, the intermediate assembly having an intermediate encapsulation supporting at least portions of the intermediate conductive elements, at least some of the second conductive elements overlying portions of corresponding ones of the intermediate conductive elements and being joined thereto, at least some of the intermediate conductive elements overlying portions of corresponding ones of the first conductive elements and being joined thereto; and a microelectronic element having contacts electrically connected with the bond pads of the lead frame, the microelectronic element overlying a die attachment pad portion of the second metal layer, the die attachment pad portion overlying at least some of the terminals, the die attachment pad portions being electrically insulated from the terminals by the first, second, and intermediate encapsulations.

10. The microelectronic assembly as claimed in claim 1 or claim 9, wherein the microelectronic element embodies a plurality of active semiconductor devices therein.

11. The microelectronic assembly as claimed in claim 1 or claim 9, wherein the microelectronic element has a plurality of passive devices, the passive devices including at least one of capacitors, inductors, or resistors.

12. The microelectronic assembly as claimed in claim 1 or claim 9, further comprising a third encapsulation insulating at least portions of the microelectronic element from at least portions of the second metal layer.

13. The microelectronic assembly as claimed in claim 12, wherein a portion of the third encapsulation extends within a space between the first and second encapsulations.

14. A microelectronic assembly, comprising:
a lead frame including a first unit and a second unit overlying the first unit and assembled therewith, the first unit having a first metal layer comprising a portion of the thickness of the lead frame and including terminals and first conductive elements extending away therefrom, the first unit having a first encapsulation supporting at least portions of the first conductive elements, the terminals exposed at a bottom surface of the first encapsulant and configured for connection with a component external to the microelectronic assembly, the second unit having a second metal layer comprising a portion of the thickness of the lead frame and including bond pads and second conductive elements extending away therefrom, the second unit having a second encapsulation supporting at least portions of the second conductive elements, at least some of the second conductive elements overlying portions of corresponding ones of the first conductive elements and being joined thereto; and a microelectronic element having contacts electrically connected with at least some of the bond pads of the lead frame, wherein at least some of the terminals are electrically connected with corresponding ones of the bond pads and are displaced therefrom in a first horizontal direction and a second horizontal direction transverse to the first horizontal direction, the first and second horizontal directions being in a horizontal plane parallel to a face of the microelectronic element, the at least some of the terminals being completely displaced in each of the first and second horizontal direction from the corresponding ones of the bond pads.

15. The microelectronic assembly as claimed in any one of claims 1, 9, or 14, wherein a pattern of the terminals defines an area array.

16. The microelectronic assembly as claimed in any one of claims 1, 9, or 14, wherein the microelectronic element has a face overlying at least some of the terminals.

17. The microelectronic assembly as claimed in any one of claims 1, 9, or 14, wherein the contacts of the microelectronic element are connected with the bond pads by wire bonds.

18. The microelectronic assembly as claimed in any one of claims 1, 9, or 14, wherein the contacts of the microelectronic element are connected with the bond pads by ribbon bonds.

19. The microelectronic assembly as claimed in any one of claims 1, 9, or 14, wherein the contacts of the microelectronic element are connected with the bond pads in a flip-chip configuration.

20. The microelectronic assembly as claimed in any one of claims 1, 9, or 14, wherein the microelectronic element is a first microelectronic element, the assembly further comprising a second microelectronic element having contacts electrically connected with at least some of the bond pads of the lead frame.

21. The microelectronic assembly as claimed in claim 20, wherein the first and second microelectronic elements are disposed adjacent to one another in a horizontal direction perpendicular to a direction of the thickness of the lead frame.

22. The microelectronic assembly as claimed in claim 20, wherein the second microelectronic element at least partially overlies the first microelectronic element.

23. The microelectronic assembly as claimed in claim 22, wherein the contacts of the first and second microelectronic elements are connected with the bond pads by wire bonds.

24. The microelectronic assembly as claimed in claim 22, wherein the contacts of the first microelectronic element are connected with the bond pads in a flip-chip configuration, and wherein the contacts of the second microelectronic element are connected with the bond pads by wire bonds.

25. A system comprising the microelectronic assembly according to any one of claims 1, 9, or 14, and one or more other electronic components electrically connected to the microelectronic assembly.

26. The system as claimed in claim 25, further comprising a housing, said microelectronic assembly and said other electronic components being mounted to said housing.

* * * * *